(12) United States Patent
Nishikawa et al.

(10) Patent No.: US 8,143,779 B2
(45) Date of Patent: Mar. 27, 2012

(54) SYSTEM FOR DISPLAYING IMAGES EMPLOYING TANDEM ELECTROLUMINESCENT DEVICE

(75) Inventors: Ryuji Nishikawa, Hsinchu (TW); Hsiang-Lun Hsu, Miaoli (TW)

(73) Assignee: Chimei Innolux Corporation, Miao-Li County (TW)

( * ) Notice: Subject to any disclaimer, the term of this patent is extended or adjusted under 35 U.S.C. 154(b) by 119 days.

(21) Appl. No.: 12/760,765

(22) Filed: Apr. 15, 2010

(65) Prior Publication Data
US 2010/0264433 A1 Oct. 21, 2010

(30) Foreign Application Priority Data
Apr. 17, 2009 (TW) .............................. 98112777 A (51) Int. Cl.
*H05B 33/00* (2006.01)
(52) U.S. Cl. ........................ 313/503; 313/506
(58) Field of Classification Search .................. 313/502, 313/503, 504, 506
See application file for complete search history.

(56) References Cited

U.S. PATENT DOCUMENTS

| | | | |
|---|---|---|---|
| 5,949,187 A * | 9/1999 | Xu et al. ........................ | 313/504 |
| 7,075,231 B1 * | 7/2006 | Liao et al. ...................... | 313/506 |
| 7,126,267 B2 * | 10/2006 | Liao et al. ...................... | 313/500 |
| 7,250,722 B2 * | 7/2007 | Cok et al. ....................... | 313/506 |
| 2002/0121860 A1 * | 9/2002 | Seo et al. ....................... | 313/506 |
| 2003/0170491 A1 * | 9/2003 | Liao et al. ...................... | 428/690 |
| 2003/0189401 A1 * | 10/2003 | Kido et al. ..................... | 313/504 |
| 2005/0175856 A1 * | 8/2005 | Rogers et al. .................. | 428/690 |

\* cited by examiner

*Primary Examiner* — Joseph L Williams
(74) *Attorney, Agent, or Firm* — Thomas|Kayden (57) ABSTRACT

A system for displaying images is provided. The system includes a tandem electroluminescent device having a first electrode. N electroluminescent units are disposed on the first electrode in sequence, wherein N is an integral and not less than 2. A second electrode is disposed on the $N_{th}$ electroluminescent unit. N−1 interconnecting electrodes are provided, wherein each of the interconnecting electrodes is disposed between two adjacent electroluminescent units. The first electroluminescent unit includes a first emitting layer and a second emitting layer in sequence from the first electrode, and the first and second emitting layer have different physical quantities. The $N_{th}$ electroluminescent unit includes a third emitting layer and a fourth emitting layer in sequence from the first electrode. The physical quantity of the third emitting layer is the same as that of the second emitting layer. The physical quantity of the fourth emitting layer is the same as that of the first emitting layer.

19 Claims, 7 Drawing Sheets

SYSTEM FOR DISPLAYING IMAGES EMPLOYING TANDEM ELECTROLUMINESCENT DEVICE

CROSS REFERENCE TO RELATED APPILCATIONS

This application is based upon and claims the benefit of priority from the prior Taiwan Patent Application No. 098112777, filed on Apr. 17, 2009, the entire contents of which are incorporated herein by reference.

BACKGROUND OF THE INVENTION

1. Field of the Invention

The invention relates to a system for displaying electroluminescent devices, and more particularly to system for displaying tandem electroluminescent devices.

2. Description of the Related Art

Recently, with advanced development of flat panel display devices applied in electronic products, such as mobile phones, personal digital assistants, and notebook computers, there has been an increased demand for flat panel display devices which consume less power and occupy less space. Accordingly, demand for organic electroluminescent devices, having self-emitting, high luminous, wide viewing angle, fast response time and relatively simply fabrication processes characteristics, has also grown.

An organic light-emitting diode (OLED) is a light-emitting diode employing an organic electroluminescent layer as an active layer. OLED display devices have high luminescent efficiency and long operating life spans.

To further improve the performance of OLEDs and achieve a full-color image for OLED display devices, tandem OLED (or stacked OLED, or cascaded OLED) display devices, which are fabricated by vertically stacking several individual OLEDs together and driven by a single power source, has been disclosed. A conventional white tandem OLED comprises a plurality of white OLEDs (comprising R, G, and B electroluminescent layers), and at least one connecting electrode, wherein each two adjacent OLEDs are separated by the connecting electrode. However, due to the stacking sequence for each white OLED having the same RGB electroluminescent layers, emission color thereof varies with the magnitude of the driving current, thereby causing color shift over time.

BRIEF SUMMARY OF THE INVENTION

An exemplary embodiment provides a system for displaying images. The system comprises a tandem electroluminescent device having a first electrode. N electroluminescent units are disposed on the first electrode in sequence, wherein N is an integral and not less than 2. A second electrode is disposed on the $N_{th}$ electroluminescent unit. N−1 interconnecting electrodes are provided, wherein each of the interconnecting electrodes is disposed between two adjacent electroluminescent units. The first electroluminescent unit comprises a first emitting layer and a second emitting layer in sequence from the first electrode, and the first and second emitting layer have different physical quantities. The $N_{th}$ electroluminescent unit comprises a third emitting layer and a fourth emitting layer in sequence from the first electrode. The physical quantity of the third emitting layer is the same as that of the second emitting layer. The physical quantity of the fourth emitting layer is the same as that of the first emitting layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
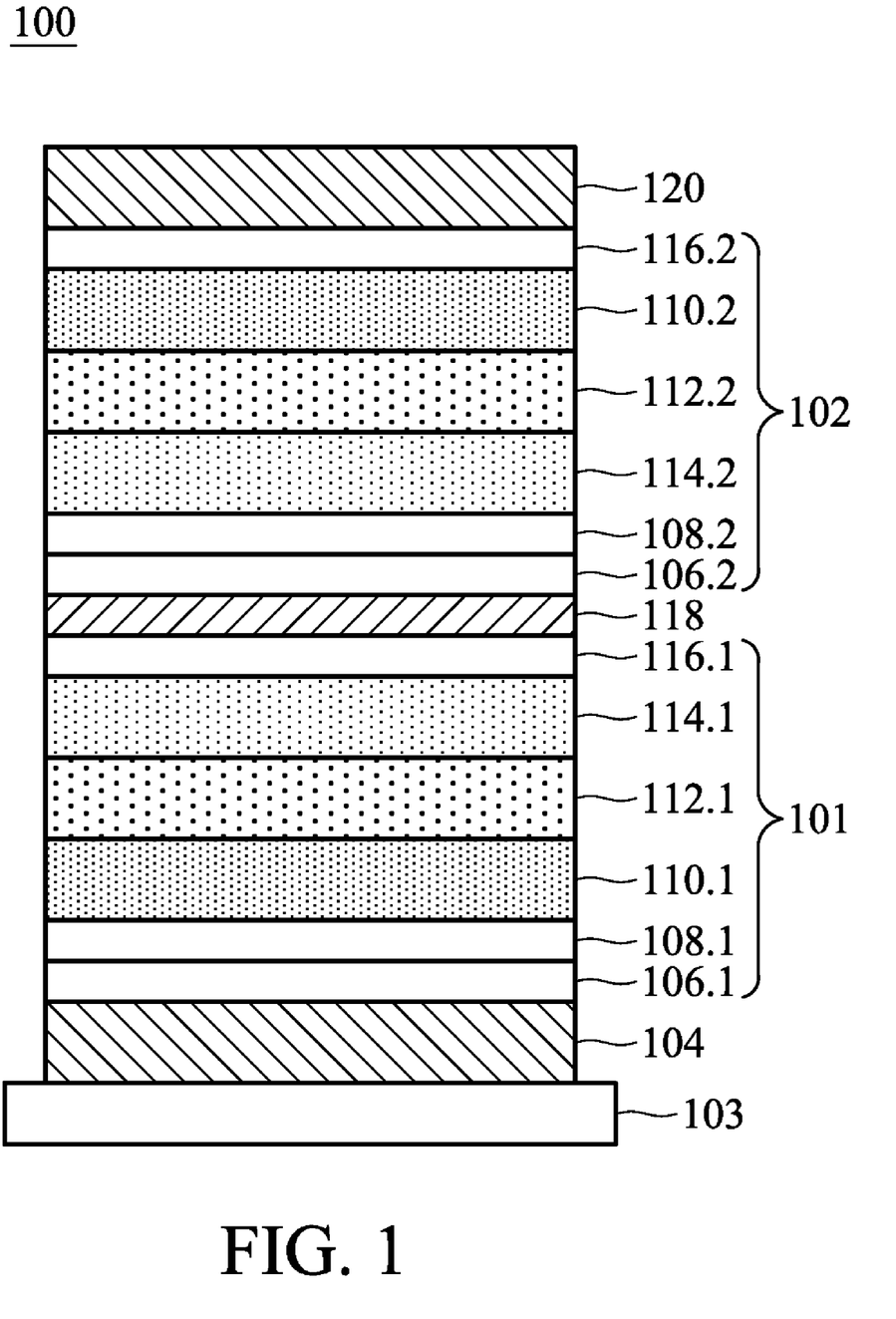
FIG. 1 is a cross-section of a tandem electroluminescent device according to an embodiment of the invention.

Referring to FIG. 1, a tandem electroluminescent device 100 employed by a system for displaying images according to an embodiment of the invention is provided. Herein, the tandem electroluminescent device 100 comprises two electroluminescent units (the first electroluminescent unit 101 and the second electroluminescent unit 102) for example. In other embodiments of the invention, the tandem electroluminescent device can comprise more than two electroluminescent units.

The tandem electroluminescent device 100 comprises a substrate 103 such as glass, ceramic, plastic, semiconductor substrate, or metal foil. Further, the substrate 103 can be a transparent or optionally opaque substrate. Specifically, a transparent substrate is used when the tandem electroluminescent device is a bottom-emission or dual emission organic electroluminescent device, and an opaque substrate is used when the tandem electroluminescent device is a top-emission organic electroluminescent device.

A first electrode 104 (such as an anode electrode) is formed on the top surface of the substrate 103. The first electroluminescent unit 101 is formed on the top surface of the first electrode 104. The first electroluminescent unit 101 comprises an emitting layer 110.1, an emitting layer 112.1, and the emitting layer 114.1 in sequence from the anode side. The first electroluminescent unit 101 can further comprise a hole injection layer 106.1 and a hole transport layer 108.1 disposed between the emitting layer 110.1 and the first electrode 104, and an electron transport layer 116.1 disposed on the emitting layer 114.1. It should be noted that the emitting layer 110.1, the emitting layer 112.1, and the emitting layer 114.1 have different physical quantities. Herein, the term "physical quantity" refers to the quantifiable properties of the whole emitting layer, such as an emitting wavelength (the wavelength with a relatively strong intensity in the luminescence spectrum of the corresponding emitting layer), electron mobility (the quality of electron mobility in the corresponding emitting layer measured by a Hall effect measurement), or hole mobility (the quality of hole mobility in the corresponding emitting layer measured by a Hall effect measurement). Moreover, the emitting layers can respectively further comprise a dopant (fluorescent or phosphorescent electroluminescent materials) and produce a blue emission, green emission, or red emission under bias voltages. Herein, the emitting layer 110.1, the emitting layer 112.1, and the emitting layer 114.1 exhibit different emission wavelengths and are respectively selected from a group consisting of a red emitting layer, a green emitting layer, and a blue emitting layer. Still referring to FIG. 1, the interconnecting electrode 118 is formed on the first electroluminescent unit 101, separating the first electroluminescent unit 101 form the sequentially formed second electroluminescent unit 102. The choice of material for the interconnecting electrode 118 is unlimited, and can be any conventional conductive materials. The second electroluminescent unit 102 is formed directly on the interconnecting electrode 118. According to an embodiment of the invention, the second electroluminescent unit 102 (the electroluminescent unit closest to the second electrode 120 (cathode electrode)) has the same emitting layers as the first electroluminescent unit 101 (the electroluminescent unit closest to the first electrode 104 (anode electrode)), and the second electroluminescent unit 102 can have an emitting layer arrangement sequence in a reverse order compared to the first electroluminescent unit 101, wherein the emitting layer arrangement sequence is arranged from the anode side.

The second electroluminescent unit 102 comprises an emitting layer 114.2 (with the same physical quantity as the emitting layer 114.1), an emitting layer 112.2 (with the same physical quantity as the emitting layer 112.1), and the emitting layer 110.2 (with the same physical quantity as the emitting layer 110.1) in sequence from the anode side. Further, the second electroluminescent unit 102 can comprise a hole injection layer 106.2 and a hole transport layer 108.2 disposed between the emitting layer 114.2 and the interconnecting electrode 118, and an electron transport layer 116.2 disposed on the emitting layer 110.2. Particularly, the emitting layer 110.1 may be the same as the emitting layer 110.2, the emitting layer 112.1 may be the same as the emitting layer 112.2, and the emitting layer 114.1 may be the same as the emitting layer 114.2.

The materials of the various layers of the first and second electroluminescent unit 101 and 102 can include small molecule organic electroluminescent materials or polymer organic electroluminescent materials. The layer of small molecule organic electroluminescent materials can be formed by thermal vacuum evaporation, or laser induced thermal imaging (LITI), and the layer of polymer organic electroluminescent materials can be formed by spin coating, ink jet printing, or screen printing.

The second electrode (such as a cathode electrode) 120 is disposed on the second electroluminescent unit 102. The first electrode and the second electrode can be independent and comprise transparent electrode, metal electrode, or combinations thereof, such as, Li, Mg, Ca, Ag, Mg, Al, Li, Au, Cu, indium tin oxide (ITO), indium zinc oxide (IZO), aluminum zinc oxide (AZO), zinc oxide (ZnO), or combinations thereof, formed by a method such as sputtering, electron beam evaporation, thermal evaporation, or chemical vapor deposition. Particularly, at least one of the first and second electrodes is a transparent electrode.

Figure 2:
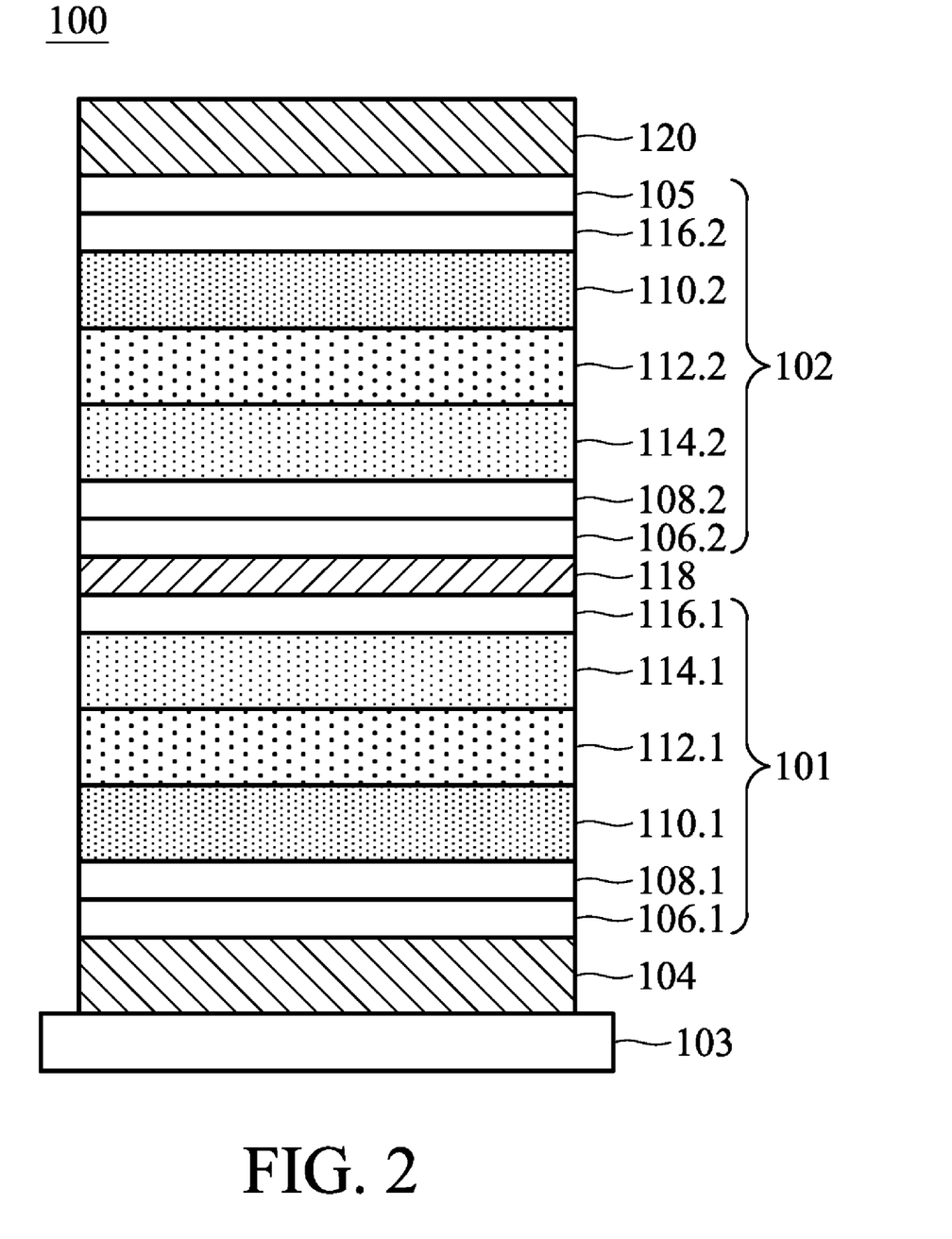
FIG. 2 is a cross-section of a tandem electroluminescent device according to another embodiment of the invention.
Figure 3:
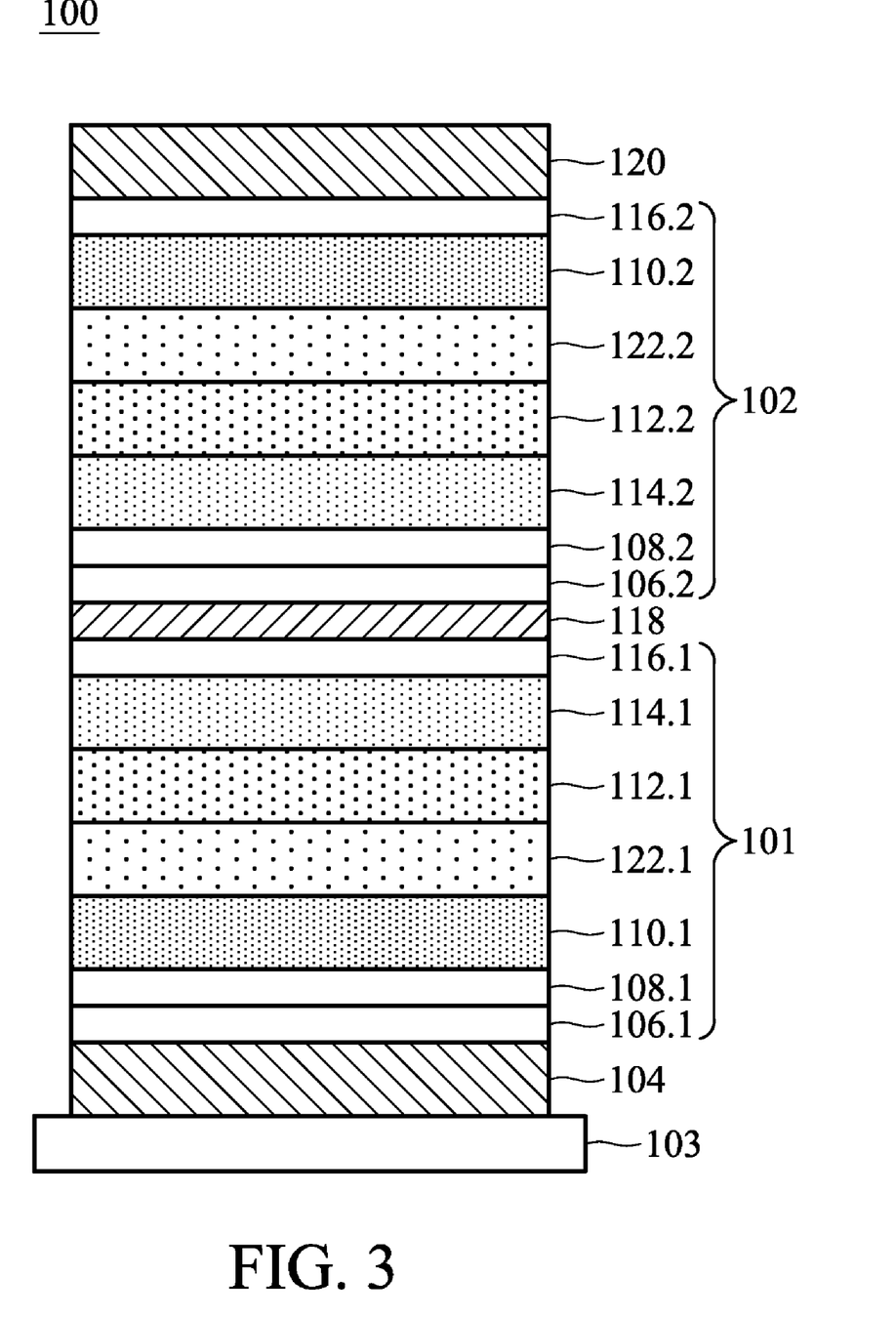
FIGS. 3 and 4 are cross-sections of tandem electroluminescent devices comprising electroluminescent units with barrier layers according to embodiments of the invention.
Figure 4:
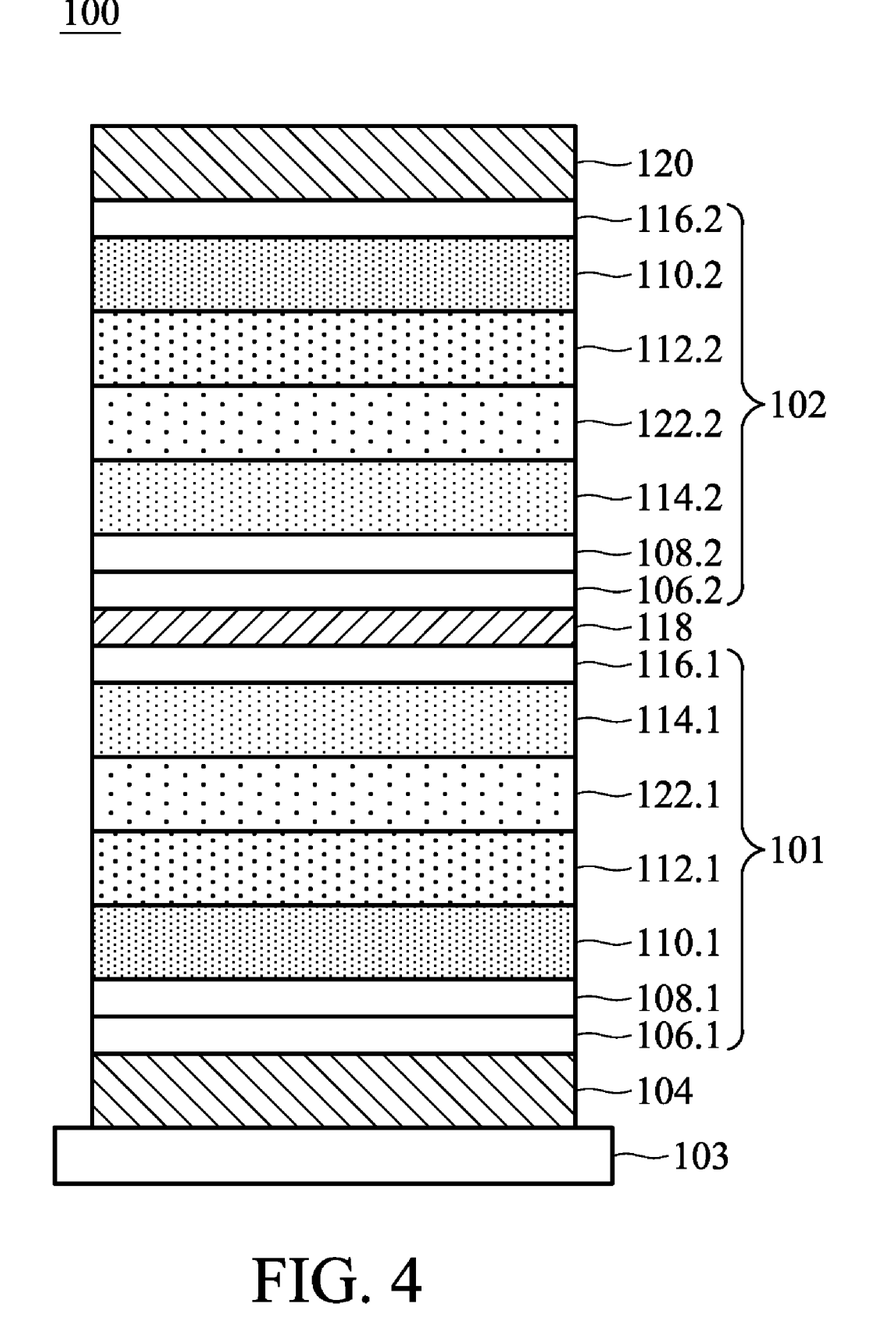

According to an embodiment of the invention, the second electroluminescent unit 102 comprises not only the various layers (in a reverse order) employed by the first electroluminescent unit 101 but also at least one organic material layer 105, wherein the organic material layer 105 can be an emitting layer, a carrier injection layer, a carrier transport layer, a buffer layer, or a protection layer, referring to FIG. 2., In some embodiment of the invention, the first electroluminescent unit 101 can further comprise a barrier layer 122.1 formed between the emitting layer 110.1 and the emitting layer 112.1, and the second electroluminescent unit 102 can comprise the same barrier layer 122.2 formed between the emitting layer 110.2 and the emitting layer 112.2, thereby enhancing the color saturation (NTSC ratio) of an organic electroluminescent diode, referring to FIG. 3. Suitable materials of the barrier layers 122.1 and 122.2 can comprise a bipolar material, an electron transport material, or a hole transport material. Further, the barrier layer 122.1 (or 122.2) can be formed between the emitting layer 112.1 and the emitting layer 114.1 of the first electroluminescent unit 101 (or the emitting layer 112.2 and the emitting layer 114.2 of the second electroluminescent unit 102, as shown in FIG. 4.

Figure 5:
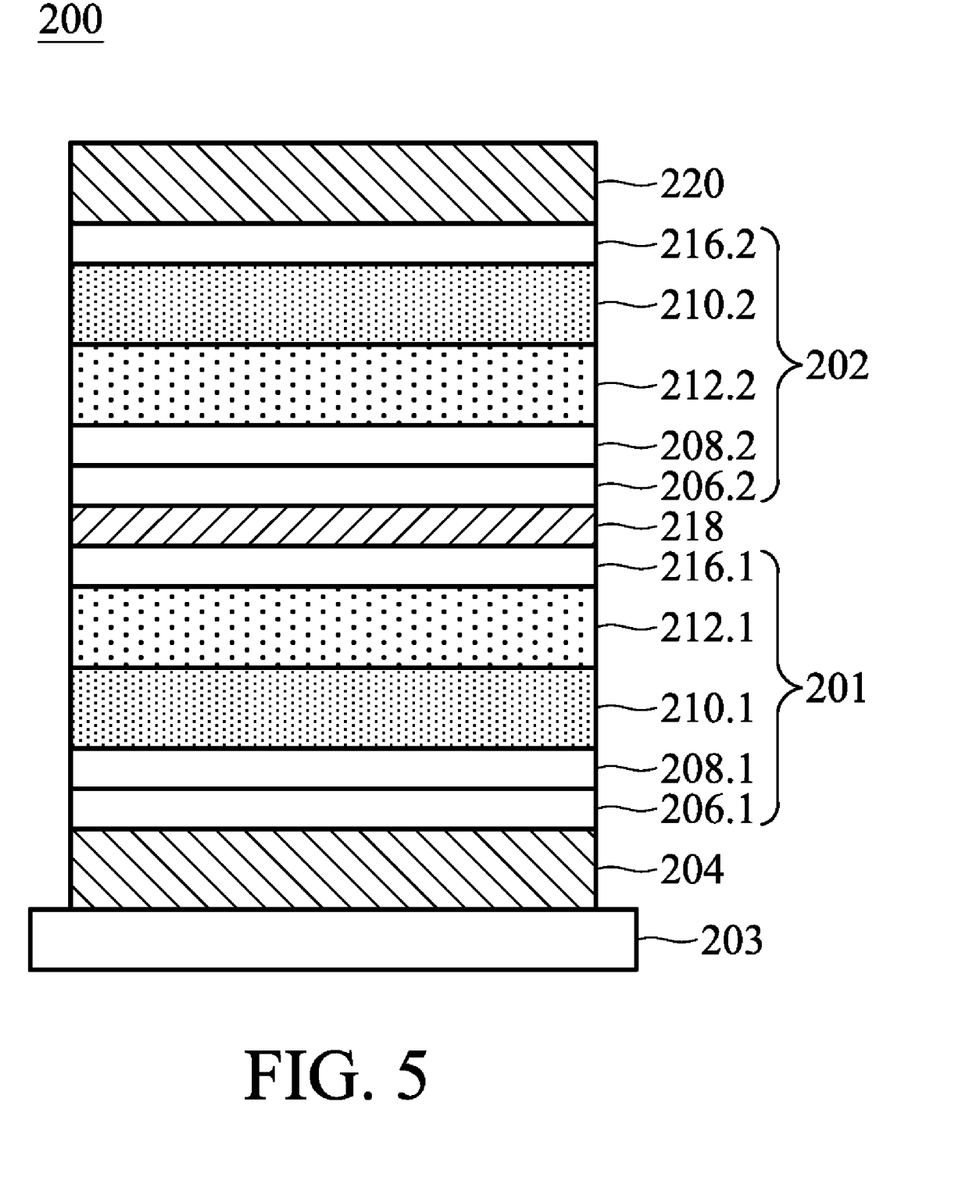
FIG. 5 is a cross-section of a tandem electroluminescent device according to still another embodiment of the invention.

Referring to FIG. 5, an embodiment of the invention provided a tandem electroluminescent device 200, comprising a substrate 203, and a first electrode 204 (anode electrode), a first electroluminescent unit 201, an interconnecting electrode 218, a second electroluminescent unit 202, and a second electrode 220 (cathode electrode) formed on the substrate 203 in sequence.

The first electroluminescent unit 201 comprises an emitting layer 210.1, and an emitting layer 212.1 in sequence from the anode side. The first electroluminescent unit 201 can further comprise a hole injection layer 206.1 and a hole transport layer 208.1 disposed between the emitting layer 210.1 and the first electrode 204, and an electron transport layer 216.1 disposed on the emitting layer 212.1. It should be noted that the emitting layer 210.1, the emitting layer 212.1, and the emitting layer 114.1 have different physical quantities. The at least one of the emitting layer 210.1 and the emitting layer 212.1 comprises at least two dopants selected from a group consisting of a red dopant, a green dopant, and a blue dopant.

For example, the emitting layer 210.1 can comprise a red dopant, and the emitting layer 212.1 can comprise a blue dopant and a green dopant. The emitting layer 210.1 can comprise a blue dopant, and the emitting layer 212.1 can comprise a red dopant and a green dopant. The emitting layer 210.1 can comprise a green dopant, and the emitting layer 212.1 can comprise a blue dopant and a red dopant. The emitting layer 210.1 can comprise a blue dopant and a green dopant, and he emitting layer 212.1 can comprise a red dopant. The emitting layer 210.1 can comprise a red dopant and a green dopant, and the emitting layer 212.1 can comprise a blue dopant, The emitting layer 210.1 can comprise a blue dopant and a red dopant, and the emitting layer 212.1 can comprise a green dopant.

Further, referring to FIG. 5, the second electroluminescent unit 202 (the electroluminescent unit closest to the second electrode 220 (cathode electrode)) can have the same emitting layers as the first electroluminescent unit 201 (the electroluminescent unit closest to the first electrode 204 (anode electrode)), and the second electroluminescent unit 202 can have an emitting layer arrangement sequence in a reverse order compared to the first electroluminescent unit 201, wherein the emitting layer arrangement sequence is arranged from the anode side. Therefore, the second electroluminescent unit 202 comprises an emitting layer 212.2 (with the same physical quantity as the emitting layer 212.1), and an emitting layer 210.2 (with the same physical quantity as the emitting layer 210.1) in sequence from the anode side.

Further, the second electroluminescent unit 202 can comprise a hole injection layer 206.2 and a hole transport layer 208.2 disposed between the emitting layer 212.2 and the interconnecting electrode 218, and an electron transport layer 216.2 disposed on the emitting layer 210.2. Particularly, the emitting layer 210.1 may be the same as the emitting layer 210.2, and the emitting layer 212.1 may be the same as the emitting layer 212.2.

Figure 6:
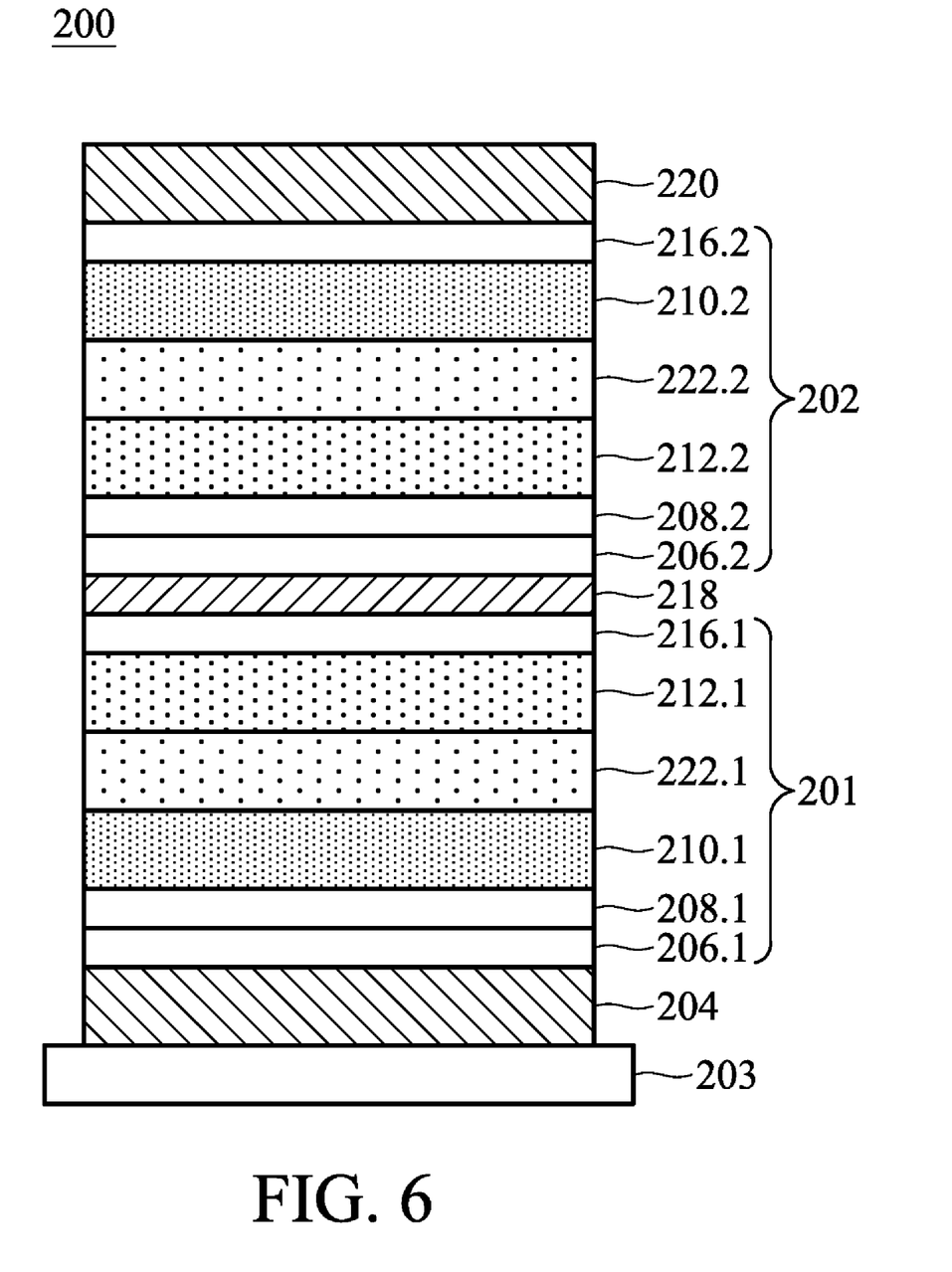
FIG. 6 is a cross-section of a tandem electroluminescent device comprising electroluminescent units with barrier layers according to embodiments of the invention.

According to another embodiment of the invention, the first electroluminescent unit 201 can further comprise a barrier layer 222.1 formed between the emitting layer 210.1 and the emitting layer 212.1, and the second electroluminescent unit 202 can comprise the same barrier layer 222.2 formed between the emitting layer 210.2 and the emitting layer 212.2, referring to FIG. 6.

Figure 7:
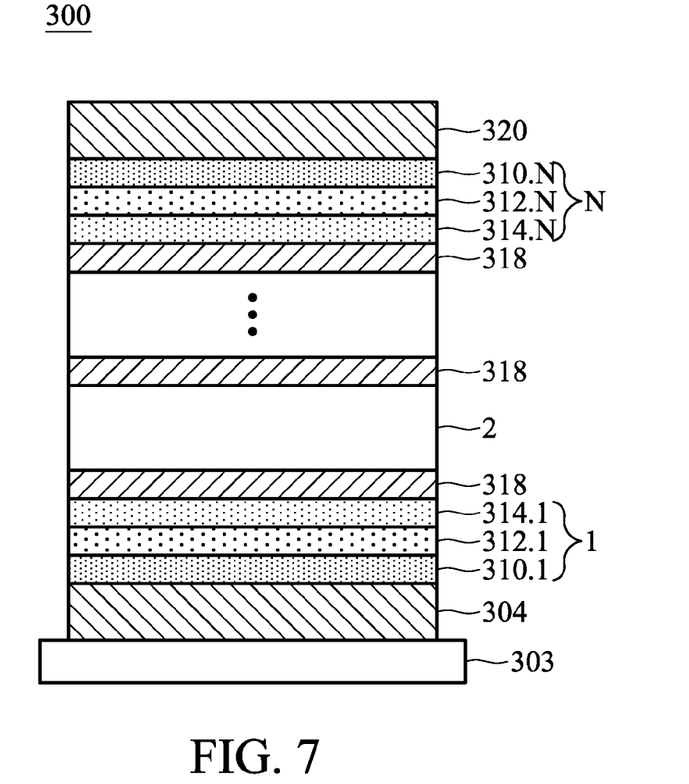
FIG. 7 is a cross-section of a tandem electroluminescent device comprising N electroluminescent units according to embodiments of the invention.

According to some embodiments of the invention, the tandem electroluminescent device can comprise N electroluminescent units, wherein N is an integral and not less than 2. Referring to FIG. 7, the tandem electroluminescent device 300 comprises N electroluminescent units, wherein N is more than 2, such as 3, 4, or 5. The tandem electroluminescent device 300 comprises a substrate 303 and comprises an anode electrode 304, a first electroluminescent unit 1, a second electroluminescent unit 2, . . . , an $N_{th}$ electroluminescent unit N, and a cathode electrode 320 formed on the substrate 303 in sequence. The tandem electroluminescent device 300 comprises a plurality of interconnecting electrodes 318, wherein each of the interconnecting electrodes 318 is disposed between two adjacent electroluminescent units. Namely, the tandem electroluminescent device 300 comprises N−1 interconnecting electrodes 318. It should be noted that the first electroluminescent unit 1 (the electroluminescent unit closest to the anode electrode 304) have the same emitting layers as the $N_{th}$ electroluminescent unit N (the electroluminescent unit closest to the cathode electrode 320), and the $N_{th}$ electroluminescent unit N can have an emitting layer arrangement sequence in a reverse order compared to the first electroluminescent unit 1, wherein the emitting layer arrangement sequence is arranged from the anode side. For Example, the first electroluminescent unit 1 comprises an emitting layer 310.1, an emitting layer 312.1, and an emitting layer 314.1 in sequence from the anode side, and the $N_{th}$ electroluminescent unit N comprises an emitting layer 314.N, an emitting layer 312.N and an emitting layer 310.N in sequence from the anode side. It should be noted that the numbers, materials, and the sequences of the emitting layers of the electroluminescent units disposed between the first electroluminescent unit 1 and the $N_{th}$ electroluminescent unit N are unlimited. The electroluminescent units disposed between the first electroluminescent unit 1 and the $N_{th}$ electroluminescent unit N can be any conventional electroluminescent units.

Accordingly, the invention provides a tandem electroluminescent device and a system for displaying images employing the same. The tandem electroluminescent device comprises a plurality of electroluminescent units, and individual electroluminescent units comprise a red emitting layer, blue emitting layer, and green emitting layer, thereby achieving full-color vision. In comparison with prior art, since the electroluminescent units of the conventional tandem electroluminescent devices have same emitting layers arranged in the same order, the emission color would vary with the magnitude of the driving current, thereby causing color shifts over time and being unable to provide a stable and unitary irradiance. In embodiments of the invention, the tandem electroluminescent device comprises N electroluminescent units, and the first electroluminescent unit and the $N_{th}$ electroluminescent unit have same emitting layers arranged in a reverse order. Therefore, emission colors do not vary with the magnitude of the driving current, resulting in stable irradiance with improved efficiency.

Figure 8:
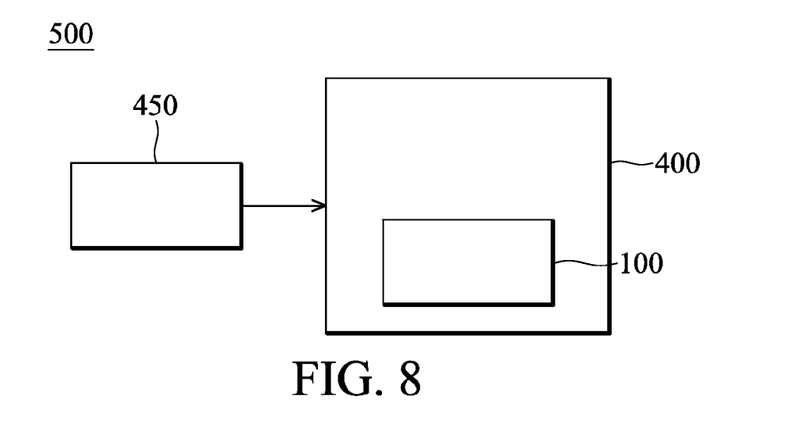
FIG. 8 schematically shows a block diagram of a system for displaying images according to another embodiment of the invention.

FIG. 8 schematically shows another embodiment of a system for displaying images which, in this case, is implemented as a display device 400 or an electronic device 500, such as a notebook computer, mobile phone, digital camera, PDA (personal data assistant), desktop computer, television, car display, or portable DVD player.

As shown in FIG. 8, the display device 400 comprises a tandem electroluminescent device (such as the tandem electroluminescent devices 100 shown in FIGS. 1-4), and the display device 400 can be a full-color organic electroluminescent display. In some embodiments, the display panel 400 can form a portion of a variety of electronic devices (in this case, electronic device 500). Generally, the electronic device 500 can comprise the display device 400 and an input unit 450. Further, the input unit 450 is operatively coupled to the display panel 400 and provides input signals (e.g., an image signal) to the display panel 400 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   a tandem electroluminescent device, comprising:
   a first electrode;
   N electroluminescent units disposed on the first electrode in sequence, wherein N is an integral and not less than 2;
   a second electrode disposed on the Nth electroluminescent unit; and
   N−1 interconnecting electrodes, wherein each of the interconnecting electrodes is disposed between two adjacent electroluminescent units,
   wherein the first electroluminescent unit comprises a first emitting layer and a second emitting layer in sequence from the first electrode and the first and second emitting layers have different physical quantities,
   wherein the Nth electroluminescent unit comprises a third emitting layer and a fourth emitting layer in sequence from the first electrode and the third and fourth emitting layers have different physical quantities,
   wherein the physical quantity of the third emitting layer is the same as that of the second emitting layer and the physical quantity of the fourth emitting layer is the same as that of the first emitting layer.

2. The system as claimed in claim 1, wherein the physical quantity comprises an emitting wavelength of the corresponding emitting layer.

3. The system as claimed in claim 1, wherein the physical quantity comprises an electron mobility of the corresponding emitting layer.

4. The system as claimed in claim 1, wherein the physical quantity comprises an hole mobility of the corresponding emitting layer.

5. The system as claimed in claim 1, wherein the first emitting layer and the second emitting layer are respectively selected from a group consisting of a red emitting layer, a green emitting layer, and a blue emitting layer.

6. The system as claimed in claim 1, wherein the at least one of the first emitting layer and the second emitting layer comprises at least two dopants selected from a group consisting of a red dopant, a green dopant, and a blue dopant.

7. The system as claimed in claim 1, wherein the first electroluminescent unit further comprises a barrier layer disposed between the first emitting layer and the second emitting layer.

8. The system as claimed in claim 7, wherein the barrier layer is a bipolar material.

9. The system as claimed in claim 1, wherein the first electroluminescent unit further comprises a fifth emitting layer disposed on the second emitting layer.

10. The system as claimed in claim 9, wherein the first emitting layer, the second emitting layer, and the fifth emitting layer have different physical quantities.

11. The system as claimed in claim 9, wherein the fifth emitting layer is selected from a group consisting of a red emitting layer, a green emitting layer, and a blue emitting layer.

12. The system as claimed in claim 9, wherein the second electroluminescent unit further comprises a sixth emitting layer disposed under the third emitting layer.

13. The system as claimed in claim 12, wherein the third emitting layer, the fourth emitting layer, and the sixth emitting layer have different physical quantities.

14. The system as claimed in claim 12, wherein the fifth emitting layer and the sixth emitting layer have a same physical quantity.

15. The system as claimed in claim 9, wherein the first electroluminescent unit further comprises a barrier layer disposed between the first emitting layer and the second emitting layer.

16. The system as claimed in claim 9, wherein the first electroluminescent unit further comprises a barrier layer disposed between the second emitting layer and the fifth emitting layer.

17. The system as claimed in claim 1, further comprising:
a display device comprising the tandem electroluminescent device.

18. The system as claimed in claim 17, further comprising:
an electronic device, wherein the electronic device comprises the display device, and an input unit is coupled to the display device to provide input to the display device such that the display device displays images.

19. The system as claimed in claim 18, wherein the electronic device is a mobile phone, digital camera, personal digital assistant, notebook computer, desktop computer, television, car display, or portable DVD player.

* * * * *